(12) United States Patent
Tseng

(10) Patent No.: US 9,330,841 B2
(45) Date of Patent: May 3, 2016

(54) BASE METAL COMBINATION ELECTRODE OF ELECTRONIC CERAMIC COMPONENT AND MANUFACTURING METHOD THEREOF

(71) Applicant: LONGKE ELECTRONICS (HUIYANG) CO., LTD., Huizhou, Guangdong (CN)

(72) Inventor: Chinglung Tseng, Taiwan (CN)

(73) Assignee: LONGKE ELECTRONICS (HUIYANG) CO., LTD., Huizhou (CN)

( * ) Notice: Subject to any disclaimer, the term of this patent is extended or adjusted under 35 U.S.C. 154(b) by 185 days.

(21) Appl. No.: 14/017,302

(22) Filed: Sep. 3, 2013

(65) Prior Publication Data

US 2014/0339955 A1    Nov. 20, 2014

(30) Foreign Application Priority Data

May 14, 2013   (CN) .......................... 2013 1 0177249

(51) Int. Cl.

| | |
|---|---|
| *H01C 7/10* | (2006.01) |
| *H01C 7/13* | (2006.01) |
| *H01G 4/005* | (2006.01) |
| *H01B 1/02* | (2006.01) |
| *C23C 4/08* | (2016.01) |
| *H01C 1/14* | (2006.01) |
| *H01C 17/10* | (2006.01) |
| *H01L 41/08* | (2006.01) |
| *H01L 41/29* | (2013.01) |

(Continued)

(52) U.S. Cl.
CPC ..... *H01G 4/005* (2013.01); *C23C 4/08* (2013.01); *H01B 1/02* (2013.01); *H01B 1/023* (2013.01); *H01B 1/026* (2013.01); *H01C 1/14* (2013.01); *H01C 7/10* (2013.01); *H01C 17/10* (2013.01); *H01G 4/228* (2013.01); *H01G 4/252* (2013.01); *H01L 41/08* (2013.01); *H01L 41/29* (2013.01); *H01G 4/12* (2013.01)

(58) Field of Classification Search
CPC ............ H01C 1/14; H01C 17/10; H01C 7/10; H01C 17/281; H01C 17/283; H01C 1/142; H01C 1/144; H01C 7/102
USPC ......... 338/21, 22 R, 307; 29/612, 592.1, 827; 361/760, 541, 762
See application file for complete search history.

(56) References Cited

U.S. PATENT DOCUMENTS 5,206,059 A * 4/1993 Marantz .................. B05B 7/203
                                              219/6.14
5,635,089 A * 6/1997 Singh .................. A61F 2/30771
                                              219/121.66

(Continued)

*Primary Examiner* — Kyung Lee

(57) ABSTRACT

The present invention provides a base metal combination electrode of electronic ceramic component and manufacturing method thereof, wherein said base metal combination electrode comprises a first base metal electrode layer covering on two sides of said electronic ceramic chip and a second base metal electrode layer covering on said first base metal electrode layer, the manufacturing method for base metal combination electrode of electronic ceramic component comprises using thermal spray equipment to spray the electrode material to the surface of electronic ceramic chip. Comparing with using silver paste or copper paste only, it reduces the cost of electrode material without destroying the function of the electrode. The manufacturing method for base metal combination electrode of the present invention has simple technological process, high preparation efficiency and low cost, and it reduces the production cost of electrode of the electronic ceramic component on the whole.

6 Claims, 8 Drawing Sheets

(51) Int. Cl.
H01G 4/228 (2006.01)
H01G 4/252 (2006.01)
H01G 4/12 (2006.01)

(56) References Cited

U.S. PATENT DOCUMENTS

| | | | |
|---|---|---|---|
| 5,703,341 A * | 12/1997 | Lowndes | B23K 26/34 |
| | | | 219/121.66 |
| 6,163,245 A * | 12/2000 | Andoh | H01C 1/142 |
| | | | 338/20 |
| 7,791,450 B2 * | 9/2010 | Choi | H01C 17/06533 |
| | | | 338/21 |
| 7,827,931 B2 * | 11/2010 | Matsushima | H01J 37/3244 |
| | | | 118/723 E |
| 2002/0134511 A1 * | 9/2002 | Ushioda | C23C 16/4581 |
| | | | 156/345.51 |
| 2005/0016969 A1 * | 1/2005 | Kessler | C04B 41/009 |
| | | | 219/121.6 |
| 2009/0199967 A1 * | 8/2009 | Himori | H01J 37/20 |
| | | | 156/345.48 |
| 2010/0140563 A1 * | 6/2010 | Kasuga | H01C 7/112 |
| | | | 252/513 |
| 2013/0292152 A1 * | 11/2013 | Kayamoto | C23C 24/04 |
| | | | 174/68.2 |

* cited by examiner

BASE METAL COMBINATION ELECTRODE OF ELECTRONIC CERAMIC COMPONENT AND MANUFACTURING METHOD THEREOF

CROSS-REFERENCE TO PRIOR APPLICATION

This application claims the benefit of Chinese Patent Application No. 201310177249.5, filed May 14, 2013, which is incorporated herein by reference.

FIELD OF THE INVENTION

The present invention relates to the technical field of base metal combination electrode of electronic ceramic component, more particularly to a base metal combination electrode of electronic ceramic component and a manufacturing method of the base metal combination electrode applying thermal spraying technology.

BACKGROUND OF THE INVENTION

The prior zinc oxide varistors (Metal Oxide Varistors) has particular nonlinear current-voltage characteristics. In use, once abnormal condition occurs, such as struck by lightning, disturbed by electromagnetic field, frequent switching of power switch and failure of power system, making the voltage in the circuit sharply increases over the break-over voltage of the zinc oxide varistors, thereby entering the conducting area. At this moment, the relationship between current (I) and voltage (V) is nonlinear known as Nonlinearity Parameter which may reach a value of tens or hundreds. At this moment, impedance of zinc oxide varistor may be lower, may be only a few ohms, making the overvoltage to form surge current and flow out, thereby protecting the connected electronic products or expensive components. The zinc oxide varistor is one kind of electronic ceramic component.

The electrode of the prior electronic ceramic component is commonly made of silver electrode material or copper electrode material. As shown in FIG. 1, a traditional electronic ceramic component has a plane shape of round or rectangle, with a silver electrode layer or copper electrode layer 112 covering on the electronic ceramic chip 111. However, since the silver electrode material is very expensive and the cost of the copper electrode material is also high, the prior single-layer silver electrode and single-layer copper electrode do not meet the requirement of modern electronics technique with products having high cost performance.

Moreover, when manufacturing silver electrode or copper electrode of the electronic ceramic component, people commonly uses fabrography to apply silver paste electrode material or copper paste electrode material and fires after that, and especially takes a step of firing in reducing atmosphere when manufacturing copper paste electrode.

The manufacturing steps of silver electrode of the prior electronic ceramic component concretely include loading material (swash plate), silver paste wire mark, drying, turn-over and wire mark, drying, firing. The manufacturing steps of copper paste electrode of electronic ceramic component concretely include loading material (swash plate), copper paste wire mark, drying, turn-over and wire mark, drying, firing in reducing atmosphere. Since the silver paste contains about 80% of silver and the copper paste contains about 70-80% of copper, using silver or copper paste as electrode material will cost a little high. The drying step is performed at a temperature of about 250° C., the firing step is performed at a temperature of about 600° C., and the reducing atmosphere step using fabrography to apply copper electrode material need to be performed in millions worth of nitrogen-hydrogen atmosphere furnace, which will consume large amounts of nitrogen-hydrogen and more than an hour to fire in reducing atmosphere. Therefore, the disadvantages of the prior art that using fabrography to apply silver paste electrode material or copper paste electrode material are complicated technological process, time-consuming production process, high cost of electrode material and equipment, etc.

SUMMARY OF THE INVENTION

On one hand, the present invention provides a base metal combination electrode of electronic ceramic component, solving a technical problem that improving the cost performance of the electronic ceramic component without destroying the function of the electrode.

In order to solve the above technical problem, the present invention takes technical solutions as following:

The present invention provides a base metal combination electrode of electronic ceramic component comprising an electronic ceramic chip and a base metal combination electrode, characterized in that:

Said base metal combination electrode comprises a first base metal electrode layer covering on two sides of said electronic ceramic chip and a second base metal electrode layer covering on said first base metal electrode layer.

Further, said first base metal electrode layer comprises one first base metal covering portion, said second base metal electrode layer comprises more than one second base metal covering portion.

Further, said first base metal electrode layer on one side of said electronic ceramic chip comprises more than one first base metal covering portion covered with second base metal covering portion; said first base metal electrode layer on another side of said electronic ceramic chip comprises more than two first base metal covering portions each covered with second base metal covering portion.

Furthermore, the shape of said first base metal electrode layer is determined according to the shape of the electronic ceramic component, but is not limited to any particular shape.

Said second base metal electrode layer is not limited to any particular shape, the covering area of which may be smaller than, equal to or bigger than the covering area of said first base metal electrode layer.

The shape and area of the second base metal electrode layer covering on two sides of said electronic ceramic chip may be same or different.

Further, said first base metal electrode layer is a main electrode layer, said second base metal electrode layer is a secondary electrode layer and weld layer, said base metal combination electrode may further comprises at least one base metal reinforced layer added between said first base metal electrode layer and said second base metal electrode layer based upon the requirements of strength and hardness.

Further, said first base metal electrode layer is made of aluminum electrode material, said second base metal electrode layer is made of copper electrode material, zinc electrode material, nickel electrode material or tin electrode material.

Said aluminum electrode material may be pure aluminum or the aluminum alloy with more than 40% of aluminum; the copper electrode material may be pure copper or the copper alloy with more than 40% of copper; the zinc electrode material may be pure zinc or the zinc alloy with more than 40% of zinc; the nickel electrode material may be pure nickel or the nickel alloy with more than 40% of nickel; the tin electrode material may be pure tin or the tin alloy with more than 40% of tin.

Further, said electronic ceramic component is any one of varistor, thermal resistor, gas sensitive resistor, piezoelectric element, humidity sensitive resistor and ceramic capacitor;

Said electronic ceramic chip may be, but is not limited to, round, rectangle, tubular, annular, cylindrical or taper in shape.

On the other hand, the present invention provides a manufacturing method for base metal combination electrode of electronic ceramic component, solving a technical problem that making the electrode of the electronic ceramic component to be manufactured with a simpler preparation technology, higher preparation efficiency, a lower cost and energy conservation.

In order to solve the above technical problem, the present invention takes technical solutions as following:

The present invention provides a manufacturing method for base metal combination electrode of electronic ceramic component, comprising: using thermal spray equipment to spray the base metal electrode material to the surface of electronic ceramic chip.

Further, manufacturing method for base metal combination electrode of said electronic ceramic component comprises:

a preparation step of loading material: loading the base metal material into a spray gun of said thermal spraying device; connecting said spray gun with power or gas source, connecting it with compressed air at the same time, and adjusting the nozzle of the spray gun to face toward a fixing device for fixing a plurality of electronic ceramic chips;

a base metal electrode layer spraying step: opening the spray gun and spraying the base metal electrode material to the surface of the plurality of electronic ceramic chips in said fixing device.

Furthermore, said preparation step of loading material comprises: loading first base metal material into a first spray gun of said thermal spray equipment; loading second base metal material into a second spray gun of said thermal spray equipment; connecting said first spray gun and second spray gun with power or gas source, connecting them with compressed air at the same time, and adjusting the nozzles of said first spray gun and second spray gun to face toward a first fixing device and a second fixing device for fixing a plurality of electronic ceramic chips, respectively.

Said first spray gun and second spray gun may be configured in two dependent sets of spraying mechanisms or one set of spraying mechanism, or may be simply configured to be a single spraying mechanism with single spray gun, wherein the first spray gun and second spray gun are defined only by the loaded first base metal material or the second base metal material.

Further, the first spraying mechanism comprising the first spray gun and the second spraying mechanism comprising the second spray gun may be present in the form of single-machine in respective processes, and they may be present in the form of double-machine or multiple-machine too. That's to say, a plurality of first spraying mechanisms and second spraying mechanisms may be configured in the production line, spraying to multi-groups of electronic ceramic chips simultaneously.

Said base metal electrode layer spraying step comprises:

a spraying step of the frontal side of a first base metal electrode layer: opening a first spray gun and spraying a first base metal electrode material to the frontal sides of the plurality of electronic ceramic chips in a first fixing device;

a spraying step of the reverse side of the first base metal electrode layer: reversing said first fixing device, opening the first spray gun, and spraying the first base metal electrode material to the reverse sides of said plurality of electronic ceramic chips;

a shifting step of the electronic ceramic chips: shifting and fixing the plurality of electronic ceramic chips sprayed with the first base metal electrode layer on both sides to the second fixing device;

a spraying step of the reverse side of a second base metal electrode layer: opening a second spray gun and spraying a second base metal electrode material to the first base metal electrode layer on the reverse sides of the plurality of electronic ceramic chips;

a spraying step of the frontal side of the second base metal electrode layer: reversing said second fixing device, opening the second spray gun, and spraying the second base metal electrode material to the first base metal electrode layer on the frontal sides of said plurality of electronic ceramic chips.

Wherein the spraying precedence order of the frontal sides or the reverse sides of the electronic ceramic chips may change, but is not limited to any particular spraying sequence. In said base metal electrode layer spraying step, after the first base metal electrode layer is sprayed to the frontal side and the reverse side of the electronic ceramic chip, the second base metal electrode material may be sprayed to the frontal side of the electronic ceramic chip.

Furthermore, after said preparation step of loading material, alternatively, said base metal electrode layer spraying step comprises:

a spraying step of the frontal side of a first base metal electrode layer: opening a first spray gun and spraying a first base metal electrode material to the frontal sides of the plurality of electronic ceramic chips in a first fixing device;

a shifting step of the electronic ceramic chips: shifting and fixing the plurality of electronic ceramic chips sprayed with the first base metal electrode layer on the frontal sides to the second fixing device;

a spraying step of the frontal side of the second base metal electrode layer: opening the second spray gun, and spraying the second base metal electrode material to the first base metal electrode layer on the frontal sides of the plurality of electronic ceramic chips;

a shifting step of the electronic ceramic chips: shifting and fixing the plurality of electronic ceramic chips sprayed with the first base metal electrode layer and the second base metal electrode layer on the frontal sides to the first fixing device, wherein the reverse sides of said plurality of electronic ceramic chips align to said first spray gun;

a spraying step of the reverse side of the first base metal electrode layer: opening the first spray gun and spraying the first base metal electrode material to the reverse sides of the plurality of electronic ceramic chips in the first fixing device;

a shifting step of the electronic ceramic chips: shifting and fixing the plurality of electronic ceramic chips sprayed with the first base metal electrode layer on the reverse sides to the second fixing device, wherein the reverse sides of said plurality of electronic ceramic chips align to said second spray gun;

a spraying step of the reverse side of the second base metal electrode layer: opening the second spray gun and spraying the second base metal electrode material to the first base metal electrode layer on the reverse sides of the plurality of electronic ceramic chips.

Wherein the spraying precedence order of the frontal sides or the reverse sides of the electronic ceramic chips may change, but is not limited to any particular spraying sequence.

In said base metal electrode layer spraying step, at first, the first base metal electrode material and the second base metal electrode material are sprayed to the reverse side of the electronic ceramic chip in turn, and then the first base metal electrode material and the second base metal electrode material are sprayed to the frontal side of the electronic ceramic chip in turn.

Further, said fixing device is a fixture tray assembly, said first fixing device and second fixing device are a first fixture tray assembly and a second fixture tray assembly, said fixture tray assembly is positioned on a turn table, said fixture tray assembly comprises an upper fixture tray and a lower fixture tray which have safe edge hole sites, wherein the plurality of cleaned electronic ceramic chips are fixed to the safe edge hole sites in said upper fixture tray and lower fixture tray, and are clamped between said upper fixture tray and lower fixture tray.

Furthermore, the contours of said first fixture tray assembly and second fixture tray assembly are determined as needed, but are not limited to any particular contour;

the shape of the safe edge hole site of said first fixture tray assembly is determined according to the shape of the electronic ceramic component, but is not limited to any particular shape;

the shape of the safe edge hole site of said second fixture tray assembly is configured according to the shape of the second base metal electrode layer, the shapes and areas of the safe edge hole sites of the upper fixture tray and lower fixture tray of said second fixture tray assembly may be same or different;

the area of the safe edge hole site of said second fixture tray assembly may be smaller than, equal to or bigger than the area of the safe edge hole site of the first fixture tray assembly.

Alternatively, said fixing device is further positioned on a conveyor belt, forming a continuous automation line device.

Further, said first base metal electrode material is aluminum, said second base metal electrode material is copper, zinc, nickel or tin; according to the mechanical strength requirements of manufacture process, said aluminum electrode material may be pure aluminum or the aluminum alloy with more than 40% of aluminum; the copper electrode material may be pure copper or the copper alloy with more than 40% of copper; the zinc electrode material may be pure zinc or the zinc alloy with more than 40% of zinc; the nickel electrode material may be pure nickel or the nickel alloy with more than 40% of nickel; the tin electrode material may be pure tin or the tin alloy with more than 40% of tin.

The present invention uses base metal such as aluminum bronze, aluminum zinc, aluminum nickel, aluminum tin and so on to serve as combination electrode material. Comparing with using silver paste or copper paste only, it reduces the cost of electrode material without destroying the function of the electrode. The present invention also uses a thermal spraying method to spray the electrode material to the surface of the electronic ceramic chip, with simple technological process, high preparation efficiency and low cost. It reduces the production cost of electrode of the electronic ceramic component on the whole, and improves the cost performance of the produced electronic ceramic component.

DETAILED DESCRIPTION OF ILLUSTRATED EMBODIMENTS

The embodiments of the present invention will now be described concretely with reference to the figures. The figures are for reference and descriptive purposes only, but do not limit the scope of the present invention.

Figure 1:
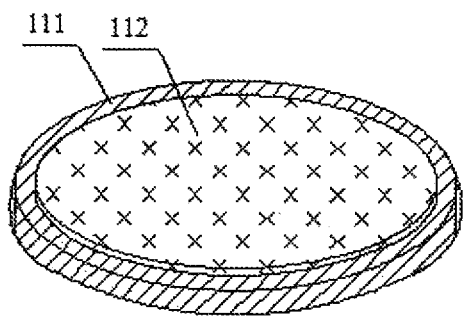
FIG. 1 is a structure diagram of the prior electrode.
Figure 2:
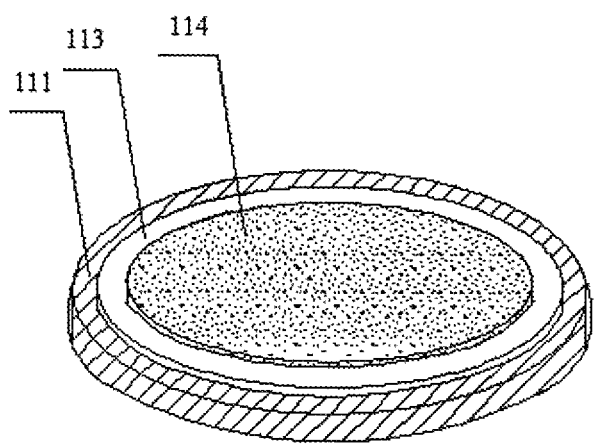
FIG. 2 is a structure diagram of the base metal combination electrode of embodiment 1 of the present invention.

Base metal combination electrode of electronic ceramic component of the present invention is illustrated by the following embodiments:

Embodiment 1:

FIG. 2 is a structure diagram of the base metal combination electrode of electronic ceramic component of embodiment 1 of the present invention. As shown in FIG. 2, said electronic ceramic component comprises an electronic ceramic chip 111 and a base metal combination electrode 113,114, said electronic ceramic chip 111 refers to a ceramic body without the electrode layer coating, said base metal combination electrode comprises a first base metal electrode layer 113 covering on two sides of said electronic ceramic chip and a second base metal electrode layer 114 covering on said first base metal electrode layer. Said second base metal electrode layer 114 is a weld layer.

In this embodiment, said first base metal electrode layer 113 is made of aluminum electrode material, and said second base metal electrode layer 114 is made of copper electrode material, thus, said first base metal electrode layer 113 is an aluminum electrode layer 113, and said second base metal electrode layer 114 is a copper electrode layer 114.

The shape of said aluminum electrode layer 113 is determined according to the shape of the electronic ceramic component, but is not limited to any particular shape. In this embodiment, said electronic ceramic component is round, and so is said aluminum electrode layer 113.

Said copper electrode layer 114 is not limited to any particular shape, the covering area of which may be smaller than, equal to or bigger than the covering area of aluminum electrode layer 113. In this embodiment, said copper electrode layer 114 comprises a copper coating portion, and said copper electrode layer 114 is round, too. The covering area of said copper electrode layer 114 is smaller than the covering area of said aluminum electrode layer 113, which means the diameter of said copper electrode layer 114 is smaller than that of said aluminum electrode layer 113.

In this embodiment, the copper electrode layers 114 covering on two sides of said electronic ceramic chip 111 are same in shape and area, both being round and same in diameter.

In this embodiment, said aluminum electrode layer 113 is a main electrode layer, said copper electrode layer 114 is a secondary electrode layer and weld layer, said aluminum-copper combination electrode may further comprise at least one base metal reinforced layer added between said aluminum electrode layer 113 and said copper electrode layer 114 based upon the requirements of strength and hardness.

In this embodiment, said electronic ceramic chip may be, but is not limited to, round, rectangle, tubular, annular, cylindrical or taper in shape. Said electronic ceramic component can be widely used in any one of ceramic capacitor, gas sensitive resistor, piezoelectric element, humidity sensitive resistor, thermal resistor and varistor.

Figure 3:
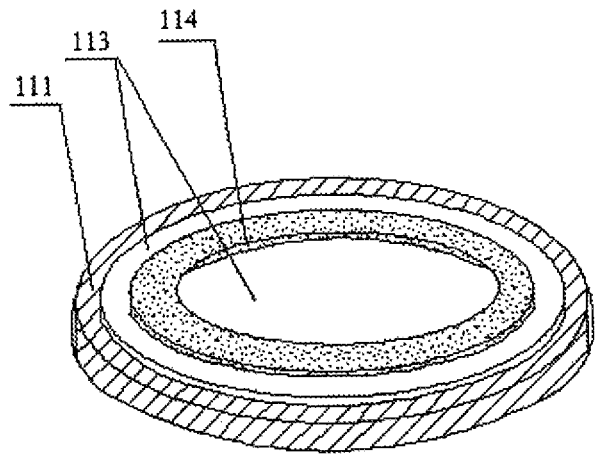
FIG. 3 is a structure diagram of the base metal combination electrode of embodiment 2 of the present invention.

Embodiment 2:

FIG. 3 is a structure diagram of base metal combination electrode of electronic ceramic component of embodiment 2 of the present invention. This embodiment is different from Embodiment 1 only in that:

In this embodiment, said first base metal electrode layer 113 is made of aluminum electrode material, and said second base metal electrode layer 114 is made of zinc electrode material, thus, said first base metal electrode layer 113 is an aluminum electrode layer 113, and said second base metal electrode layer 114 is a zinc electrode layer 114.

Besides, as shown in FIG. 3, said zinc electrode layer 114 is annular. In this embodiment, the annular has a width of 2 mm at least and 30 mm at most.

Figure 4:
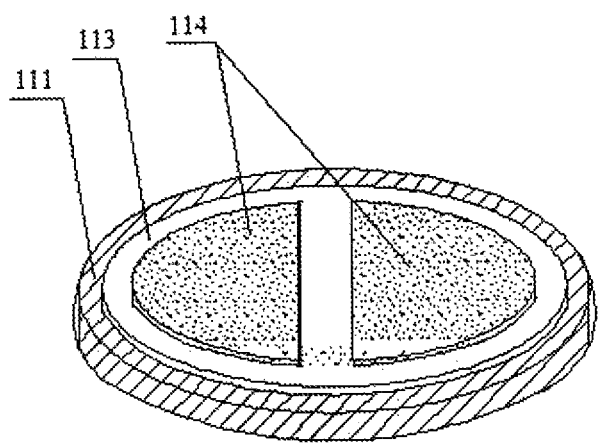
FIG. 4 is a structure diagram of the base metal combination electrode of embodiment 3 of the present invention.

Embodiment 3:

FIG. 4 is a structure diagram of the base metal combination electrode of electronic ceramic component of embodiment 3 of the present invention. This embodiment is different from Embodiment 1 only in that:

In this embodiment, said first base metal electrode layer 113 is made of aluminum electrode material, and said second base metal electrode layer 114 is made of tin electrode material, thus, said first base metal electrode layer 113 is an aluminum electrode layer 113, and said second base metal electrode layer 114 is a tin electrode layer 114.

Besides, as shown in FIG. 4, said tin electrode layer 114 covering on one side of the electronic ceramic chip 111 comprises a plurality of covering portions separated from each other. In this embodiment, said tin electrode layer 114 comprises two half-round covering portions, the separation distance between which is more than 1 mm.

Figure 5A:
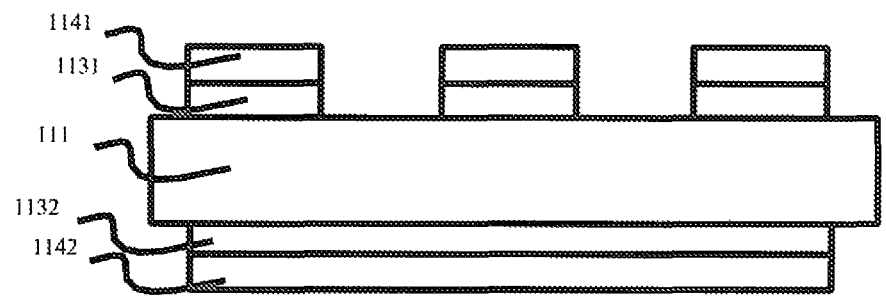
FIG. 5A is a structure diagram of the base metal combination electrode of embodiment 4 of the present invention.
Figure 5B:
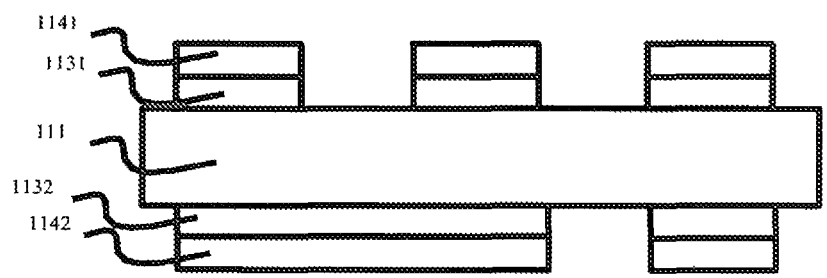
FIG. 5B is a structure diagram of the base metal combination electrode of embodiment 4 of the present invention.

Embodiment 4:

FIGS. 5A, 5B are structure diagrams of the base metal combination electrode of electronic ceramic component of embodiment 4 of the present invention. This embodiment is different from Embodiment 1 only in that:

Said aluminum electrode layer 1131 on one side of said electronic ceramic chip comprises more than one aluminum covering portion covered with zinc covering portion 1141. In FIG. 5A, said aluminum electrode layer 1132 on one side of the electronic ceramic chip comprises one aluminum covering portion, and in FIG. 5B, said aluminum electrode layer 1132 comprises two aluminum covering portions. Said aluminum electrode layer 1131 on another side of said electronic ceramic chip comprises more than two aluminum covering portions each covered with zinc covering portion 1141. In FIGS. 5A, 5B, said aluminum electrode layer 1131 on another side of said electronic ceramic chip comprises three aluminum covering portions.

The base metal combination electrode structure of the present embodiment may form, on one electronic ceramic chip, a plurality of electronic ceramic components, such as ceramic capacitor, gas sensitive resistor, piezoelectric element, humidity sensitive resistor, thermal resistor, varistor and so on, and the electrodes of the plurality of formed resistors or capacitance ceramic components may be connected with each other.

Figure 6:
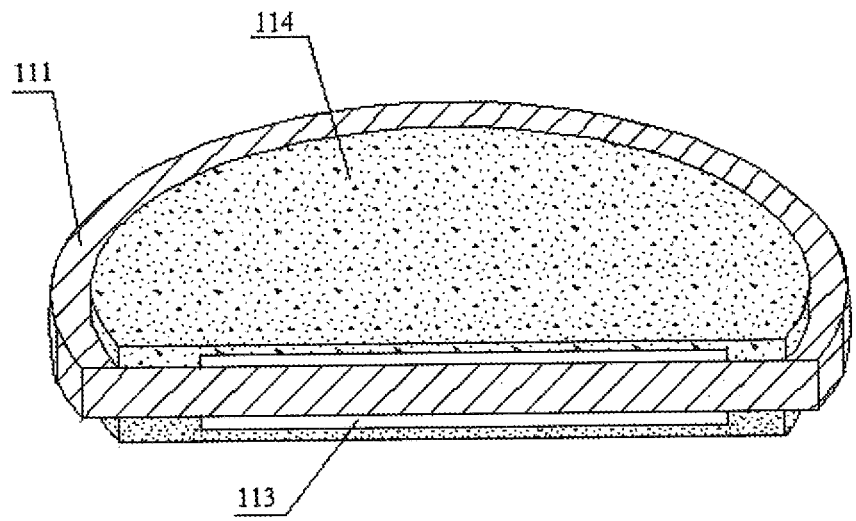
FIG. 6 is a structure diagram of the base metal combination electrode of embodiment 5 of the present invention.

Embodiment 5:

FIG. 6 is a structure diagram of base metal combination electrode of electronic ceramic component of embodiment 5 of the present invention. This embodiment is different from Embodiment 1 only in that:

The covering area of said nickel electrode layer 114 is bigger than the covering area of said aluminum electrode layer 113, which means the diameter of said nickel electrode layer 114 is bigger than that of said aluminum electrode layer 113.

As shown in FIG. 6, the peripheral portion of the nickel electrode layer 114 covers on the electronic ceramic chip 111 directly. In this embodiment, the diameter of the first electrode layer is no less than 2 mm, and the diameter of the second electrode layer is no less than 2.5 mm.

Figure 7:
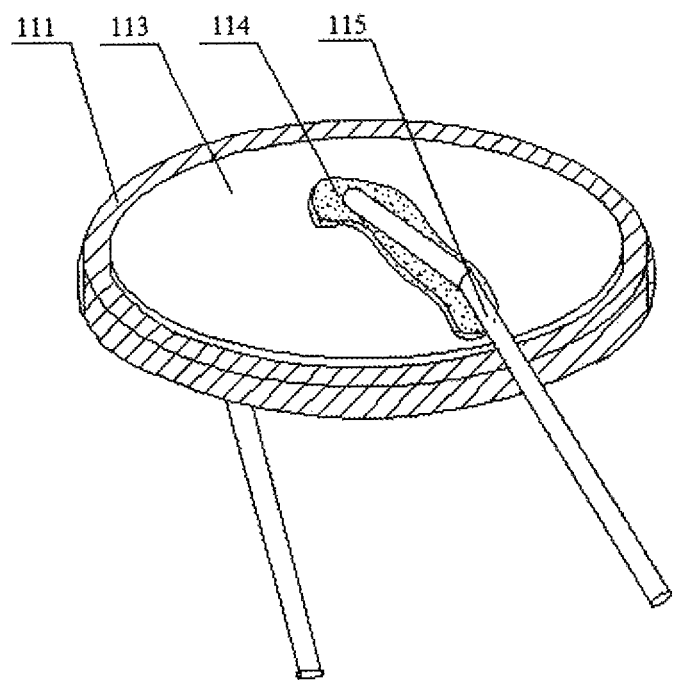
FIG. 7 is a structure diagram of the base metal combination electrode of embodiment 6 of the present invention.

Embodiment 6:

FIG. 7 is a structure diagram of base metal combination electrode of electronic ceramic component of embodiment 6 of the present invention. This embodiment is different from Embodiment 1 only in that:

As shown in FIG. 7, said copper electrode layer 114 only covers on the portion for welding electrode to lead a wire out. In this embodiment, the shapes and areas of the copper electrode layer 114 covering two sides of said electronic ceramic chip 111 are different, that's to say, the copper electrode layers 114 on two sides are asymmetric to meet the needs of different welding electrodes to lead wires out.

Manufacturing method for base metal combination electrode of electronic ceramic component of the present invention is illustrated by the following embodiments:

Embodiment 7:

A manufacturing method for base metal combination electrode of electronic ceramic component of the present embodiment comprises: using thermal spray equipment to spray the base metal electrode material to the surface of the electronic ceramic chip of the electronic ceramic component.

Said electronic ceramic component includes varistor, ceramic capacitor, thermal resistor, gas sensitive resistor, humidity sensitive resistor and piezoelectric element. Said electronic ceramic chip may be, but is not limited to, round, rectangle, tubular, annular, cylindrical or taper in shape.

Said thermal spray equipment may be electric arc spraying equipment or flame spraying equipment. In this embodiment, the electric arc spraying method is used.

Figure 8:
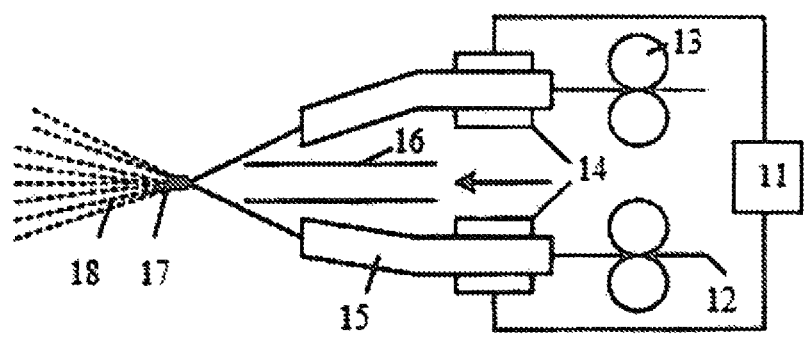
FIG. 8 is a structure diagram of electric arc spraying equipment.

FIG. 8 shows the structure of spray gun of the electric arc spraying equipment. The electric arc spraying equipment may comprise a plurality of spray guns comprising direct-current power supply 11, metal wire 12, wire feeding roll 13, conductive block 14, contact tip 15 and air nozzle 16. FIG. 8 further shows the generated electric arc 17 and the generated spraying fluid 18.

Figure 10:
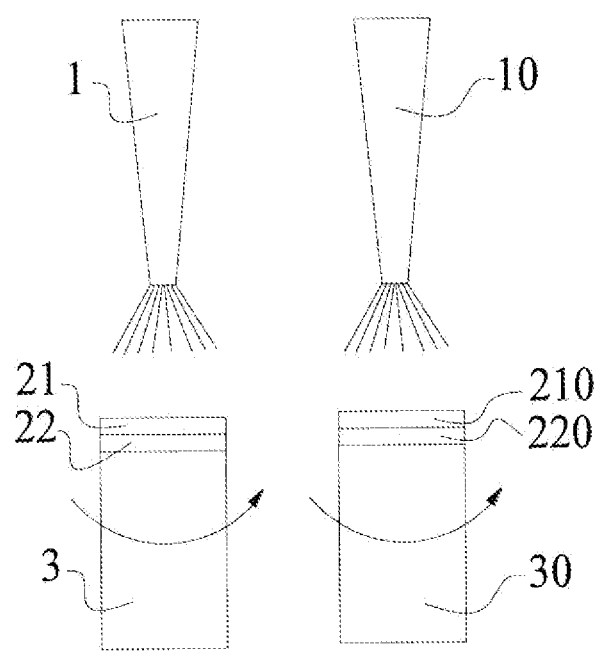
FIG. 10 is an equipment diagram of manufacturing method for electrode of electronic ceramic component of the present invention.

In this embodiment, as shown in FIG. 10, the electronic ceramic chip to be sprayed is clamped between the upper fixture tray 21, 210 and lower fixture tray 22, 220 of the fixture tray assembly 2, 20 which is fixed on the turn table 3, 30.

In this embodiment, said base metal electrode material is aluminum and zinc. The technological process for manufacturing aluminum-zinc combination electrode of electronic ceramic component concretely comprises:

A preparation step of loading material:

Setting the working environment and parameters of spray gun: ambient temperature: 0-35° C., power supply: 380V; gas source 0.6 MPa<P<1.0 MPa; flow rate is about 0.9 m³/min.

Loading aluminum electrode material into a first spray gun 1 of said thermal spray equipment; loading zinc electrode material into a second spray gun 10 of said thermal spray equipment.

According to the mechanical strength requirements of manufacture process, said aluminum electrode material may be pure aluminum or the aluminum alloy with more than 40% of aluminum; the zinc electrode material may be pure zinc or the zinc alloy with more than 40% of zinc.

Connecting said first spray gun 1 and second spray gun 10 with power supply, connecting them with compressed air at the same time, and adjusting the nozzles of said first spray gun 1 and second spray gun 10 to face toward tool fixing positions of a first turn table 3 and a second turn table 30, and preparing to start.

Figure 11:
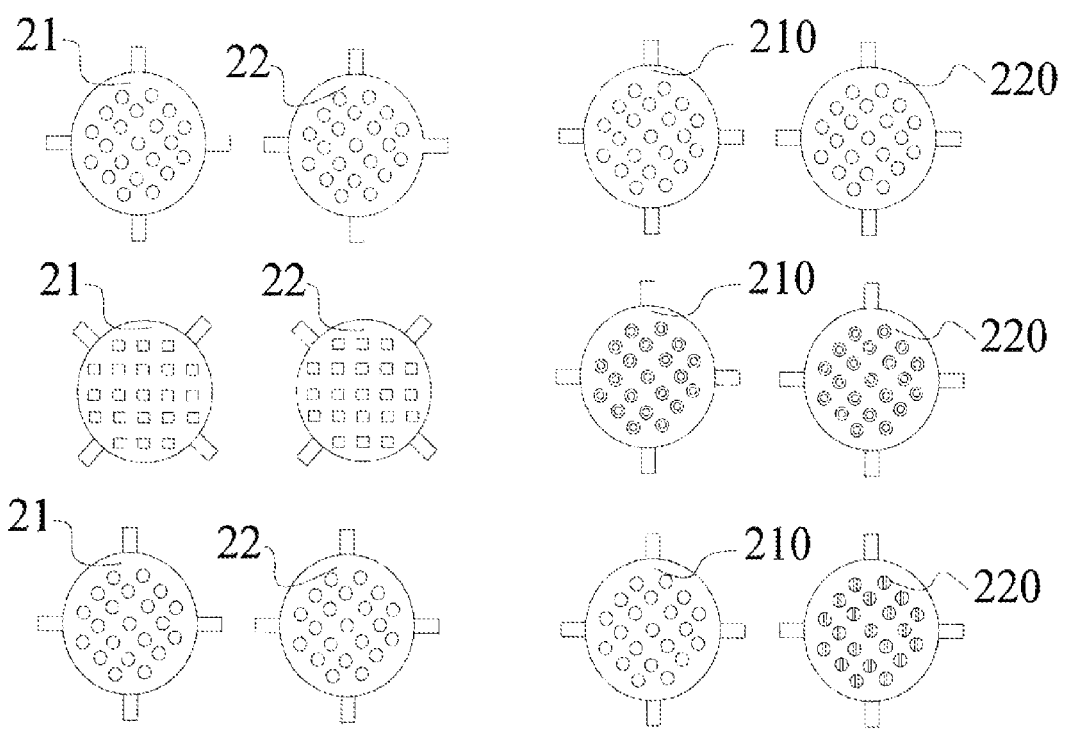
FIG. 11 is a structure diagram of the fixture tray assembly in the preparation device of electrode of the electronic ceramic component as depicted in FIG. 10.

As shown in FIG. 10, said first turn table 3 and second turn table 30 are configured with a first fixture tray assembly 2 and a second fixture tray assembly 20, respectively. The first fixture tray assembly 2 and second fixture tray assembly 20 are fixing devices for fixing a plurality of electronic ceramic chips 5, wherein the contours of said first fixture tray assembly and second fixture tray assembly are determined as needed, but are not limited to any particular contour, and the shape of the safe edge hole site of said first fixture tray assembly 2 is determined according to the shape of the electronic ceramic component, but is not limited to any particular hole shape, making sure that performance of the covered aluminum electrode will not be affected. As shown in FIG. 11, in this embodiment, the safe edge hole sites of the upper fixture tray 21 and lower fixture tray 22 of the first fixture tray assembly 2 are all round. The shape of the safe edge hole site of said second fixture tray assembly 20 is determined according to the shape of zinc electrode, it may be, but is not limited to, round, half round, rectangle, annular, diamond, trapezoid, triangle, polygon, L-shape, etc. FIG. 11 shows three groups of structure embodiments of the first fixture tray assembly 2 and the second fixture tray assembly 20.

Figure 12:
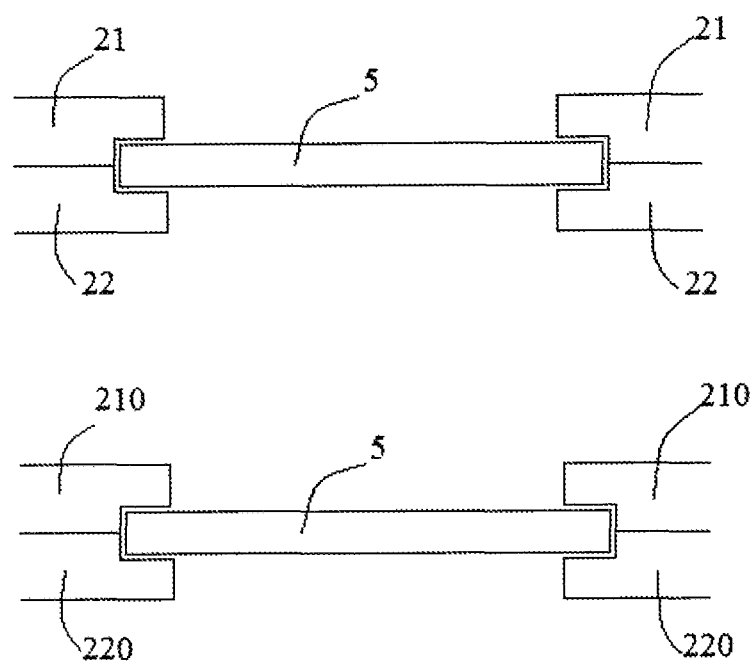
FIG. 12 shows a structure diagram of the electronic ceramic component fixed in the fixture tray assembly as depicted in FIG. 11.

The shapes and areas of the safe edge hole sites of the upper fixture tray 210 and lower fixture tray 220 of said second fixture tray assembly 20 may be same or different. As shown in FIG. 11, the safe edge hole sites of the upper fixture tray 210 and lower fixture tray 220 of the second fixture tray assembly 20 may all be round, annular or half round. Alternatively, the safe edge hole site of the upper fixture tray 210 is round and the safe edge hole site of the lower fixture tray 220 is annular or half round, all being not limited to these shapes. Furthermore, the area of the safe edge hole site of the second fixture tray assembly 20 may be smaller than, equal to or bigger than the area of the safe edge hole site of the first fixture tray assembly 2. Fixing the plurality of cleaned electronic ceramic chips 5 to the first fixture tray assembly 2 as depicted in FIG. 12, said electronic ceramic chips 5 are embedded between the safe edge hole sites of the upper fixture tray 21 and lower fixture tray 22.

Said first spray gun and second spray gun may be configured in two dependent sets of spraying mechanisms or one set of spraying mechanism, or may be simply configured to be a single spraying mechanism with single spray gun, wherein the first spray gun and second spray gun are defined just by the loaded first base metal material or the second base metal material.

Further, the first spraying mechanism comprising the first spray gun and the second spraying mechanism comprising the second spray gun may be present in the form of single-machine in respective processes, and they may be present in the form of double-machine or multiple-machine too. That's to say, a plurality of first spraying mechanisms and second spraying mechanisms may be configured in the production line, spraying to multi-groups of electronic ceramic chips simultaneously.

The base metal electrode layer spraying step comprises:

The frontal side of aluminum electrode layer spraying step: starting said first turn table 3, driving the plurality of electronic ceramic chips on said first fixture tray assembly 2 to rotate uniformly, and then starting the first spray gun 1 to spray aluminum electrode material to the frontal sides of the plurality of electronic ceramic chips of the first fixture tray assembly 2, wherein the spraying time may be set to 1-10 seconds according to the requirements, and the distance from the nozzle to the electronic ceramic chip to be sprayed may be 50 mm-250 mm.

The reverse side of the aluminum electrode layer spraying step: reversing said first fixture tray assembly 2, opening the first spray gun to spray the aluminum electrode material to the reverse sides of said plurality of electronic ceramic chips.

A shifting step of the electronic ceramic chips: shifting and fixing the plurality of electronic ceramic chips sprayed with the aluminum electrode layer on both sides to the second fixture tray assembly 20 on the second turn table 30. As shown in FIG. 11, said electronic ceramic chip 5 sprayed with the aluminum electrode material is embedded between the safe edge hole sites of the upper fixture tray 210 and lower fixture tray 220. In the condition that the shapes and areas of the aluminum electrode layer and the zinc electrode layer are same, there is no need to replace the fixture tray assembly.

The reverse side of zinc electrode layer spraying step: starting said second turn table 30, driving the plurality of electronic ceramic chips on said second fixture tray assembly 20 to rotate uniformly, and then starting the second spray gun 10 to spray zinc electrode material to the aluminum electrode layer on the reverse sides of the plurality of electronic ceramic chips, wherein the spraying time may be set to 1-10 seconds according to the requirements, and the distance from the nozzle to the electronic ceramic chip to be sprayed may be 50 mm-250 mm.

The frontal side of the zinc electrode layer spraying step: reversing said second fixture tray assembly 20, opening the second spray gun to spray the zinc electrode material to the aluminum electrode layer on the frontal sides of said plurality of electronic ceramic chips.

Wherein the spraying precedence order of the frontal sides or the reverse sides of the electronic ceramic chips may change, but is not limited to any particular spraying sequence. In said base metal electrode layer spraying step, after the first base metal electrode layer is sprayed to the frontal side and the reverse side of the electronic ceramic chip, the second base metal electrode material may be sprayed to the frontal side of the electronic ceramic chip.

In this embodiment, the fixing device for fixing the plurality of electronic ceramic chips 5 may be positioned on a conveyor belt, wherein the shifting step of the electronic ceramic chips may realize automation by delivering via the conveyor belt. When spraying the reverse side of electrode layer, people may reverse and fix the plurality of electronic ceramic chips 5 in the fixing device by reversing the conveyor belt.

Embodiment 8:

This embodiment is different from Embodiment 7 only in that:

After said preparation step of loading material, alternatively, said base metal electrode layer spraying step comprises:

The frontal side of aluminum electrode layer spraying step: starting said first turn table 3, driving the plurality of electronic ceramic chips on said first fixture tray assembly 2 to rotate uniformly, and then starting the first spray gun 1 to spray aluminum electrode material to the frontal sides of the plurality of electronic ceramic chips of the first fixture tray assembly 2, wherein the spraying time may be set to 1-10 seconds according to the requirements, and the distance from the nozzle to the electronic ceramic chip to be sprayed may be 50 mm-250 mm.

A shifting step of the electronic ceramic chips: shifting and fixing the plurality of electronic ceramic chips sprayed with the aluminum electrode layer on the frontal side to the second fixture tray assembly 20 on the second turn table 30, wherein the frontal sides of said plurality of electronic ceramic chips align to said second spray gun. In the condition that the shapes and areas of the aluminum electrode layer and the zinc electrode layer are same, there is no need to replace the fixture tray assembly.

The frontal side of zinc electrode layer spraying step: starting said second turn table 30, driving the plurality of electronic ceramic chips on said second fixture tray assembly 20 to rotate uniformly, and then starting the second spray gun 10 to spray zinc electrode material to the aluminum electrode layer on the frontal sides of the plurality of electronic ceramic chips, wherein the spraying time may be set to 1-10 seconds according to the requirements, and the distance from the nozzle to the electronic ceramic chip to be sprayed may be 50 mm-250 mm.

A shifting step of the electronic ceramic chips: shifting and fixing the plurality of electronic ceramic chips sprayed with the aluminum electrode layer and the zinc electrode layer on the frontal side to the first fixture tray assembly 2 on the first turn table 3, wherein the reverse sides of said plurality of electronic ceramic chips align to said first spray gun. In the condition that the shapes and areas of the aluminum electrode layer and the zinc electrode layer are same, there is no need to replace the fixture tray assembly.

The reverse side of aluminum electrode layer spraying step: starting said first turn table 3, driving the plurality of electronic ceramic chips on said first fixture tray assembly 2 to rotate uniformly, and then starting the first spray gun 1 to spray aluminum electrode material to the reverse sides of the plurality of electronic ceramic chips in the first fixture tray assembly 2, wherein the spraying time may be set to 1-10 seconds according to the requirements, and the distance from the nozzle to the electronic ceramic chip to be sprayed may be 50 mm-250 mm.

A shifting step of the electronic ceramic chips: shifting and fixing the plurality of electronic ceramic chips sprayed with the aluminum electrode layer on the reverse side to the second fixture tray assembly 20 on the second turn table 30, wherein the reverse sides of said plurality of electronic ceramic chips aligns to said second spray gun. In the condition that the shapes and areas of the aluminum electrode layer and the zinc electrode layer are same, there is no need to replace the fixture tray assembly.

The reverse side of zinc electrode layer spraying step: starting said second turn table 30, driving the plurality of electronic ceramic chips on said second fixture tray assembly 20 to rotate uniformly, and then starting the second spray gun 10 to spray zinc electrode material to the aluminum electrode layer on the reverse sides of the plurality of electronic ceramic chips, wherein the spraying time may be set to 1-10 seconds according to the requirements, and the distance from the nozzle to the electronic ceramic chip to be sprayed may be 50 mm-250 mm.

Wherein the spraying precedence order of the frontal sides or the reverse sides of the electronic ceramic chips may change, but is not limited to any particular spraying sequence. In said base metal electrode layer spraying step, at first, the first base metal electrode material and the second base metal electrode material may be sprayed to the reverse side of the electronic ceramic chip in turn, and then the first base metal electrode material and the second base metal electrode material may be sprayed to the frontal side of the electronic ceramic chip in turn.

Said first spray gun and second spray gun may be configured in two dependent sets of spraying mechanisms or one set of spraying mechanism, or may be simply configured to be a single spraying mechanism with single spray gun, wherein the first spray gun and second spray gun are defined just by the loaded first base metal material or the second base metal material.

Meanwhile, the method of this embodiment is also applicable to manufacture base metal combination electrodes such as aluminum copper, aluminum tin, aluminum nickel, etc.

In this embodiment, the fixing device for fixing the plurality of electronic ceramic chips 5 may be positioned on a conveyor belt, wherein the shifting step of the electronic ceramic chips may realize automation by delivering via the conveyor belt. When spraying the reverse side of electrode layer, people may reverse and fix the plurality of electronic ceramic chips 5 in the fixing device by reversing the conveyor belt.

Embodiment 9:

This embodiment is different from Embodiment 7 only in that: Manufacturing method for base metal combination electrode of electronic ceramic component of the present embodiment comprises: using a electric arc spraying device to spray the base metal electrode material to the surface of the electronic ceramic chip of the electronic ceramic component, wherein said electrode material is aluminum and tin. That's to say, tin replaces zinc used in Embodiment 7.

According to the mechanical strength requirements of manufacture process, said aluminum electrode material may be pure aluminum or the aluminum alloy with more than 40% of aluminum; the tin electrode material may be pure tin or the tin alloy with more than 40% of tin.

The production process of aluminum-tin combination electrode of electronic ceramic component in this embodiment is the same as the production process of aluminum-zinc electrode in Embodiment 7.

Embodiment 10:

This embodiment is different from Embodiment 7 only in that: Manufacturing method for base metal combination electrode of electronic ceramic component of the present embodiment comprises: using a electric arc spraying device to spray the base metal electrode material to the surface of the electronic ceramic chip of the electronic ceramic component, wherein said electrode material is aluminum and copper. That's to say, copper replaces zinc used in Embodiment 7.

According to the mechanical strength requirements of manufacture process, said aluminum electrode material may be pure aluminum or the aluminum alloy with more than 40% of aluminum; the copper electrode material may be pure copper or the copper alloy with more than 40% of copper.

The production process of aluminum-copper combination electrode of electronic ceramic component in this embodiment is the same as the production process of aluminum-zinc electrode in Embodiment 7.

Embodiment 11:

This embodiment is different from Embodiment 7 only in that: Manufacturing method for base metal combination electrode of electronic ceramic component of the present embodiment comprises: using a electric arc spraying device to spray the base metal electrode material to the electrode surface of the electronic ceramic chip of the electronic ceramic component, wherein said electrode material is aluminum and nickel. That's to say, nickel replaces zinc used in Embodiment 7.

According to the mechanical strength requirements of manufacture process, said aluminum electrode material may be pure aluminum or the aluminum alloy with more than 40% of aluminum; the nickel electrode material may be pure nickel or the nickel alloy with more than 40% of nickel.

The production process of aluminum-nickel combination electrode of electronic ceramic component in this embodiment is the same as the production process of aluminum-zinc electrode in Embodiment 7.

Embodiment 12:

This embodiment is different from Embodiment 7 only in that: Manufacturing method for base metal combination electrode of electronic ceramic component of the present embodiment comprises: using a flame spraying device to spray the base metal electrode material described in Embodiment 7 to the surface of the electronic ceramic chip of the electronic ceramic component.

Figure 9:
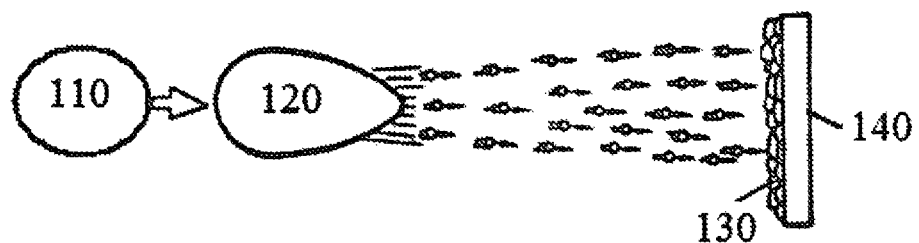
FIG. 9 is a schematic diagram of flame spraying equipment.

FIG. 9 shows a schematic diagram of flame spraying equipment. The flame spraying is implemented by means of flame spray gun, mainly using the combustion of oxygen-acetylene to generate high-temperature fire so as to fuse the spray material 110, and using the compressed air around to make the fused materials or particles to form ion beam 120 so as to spray it and make it adhered to the substrate surface 140, forming a coating 130. The flame spraying includes wire flame spraying and powder flame spraying.

In this embodiment, aluminum and zinc electrode material may be in the form of thread or powder.

The production process of electrode of electronic ceramic component in this embodiment is the same as that in Embodiment 7, excepting that the flame spray gun starts to work after being connected with gas source.

Embodiment 13:

This embodiment is different from Embodiment 7 only in that: Manufacturing method for base metal combination electrode of electronic ceramic component of the present embodiment comprises: using a flame spraying device described in Embodiment 12 to spray the tin electrode material described in Embodiment 9 to the surface of the electronic ceramic chip of the electronic ceramic component, wherein said electrode material is aluminum and tin. That's to say, tin replaces zinc used in Embodiment 7.

The production process of aluminum-tin electrode of electronic ceramic component in this embodiment is the same as the production process of aluminum-zinc electrode in Embodiment 7.

Embodiment 14:

This embodiment is different from Embodiment 7 only in that: Manufacturing method for base metal combination electrode of electronic ceramic component of the present embodiment comprises: using a flame spraying device in Embodiment 12 to spray the base metal electrode material described in Embodiment 10 to the surface of the electronic ceramic chip of the electronic ceramic component, wherein said electrode material is aluminum and copper. That's to say, copper replaces zinc used in Embodiment 7.

The production process of aluminum-copper electrode of electronic ceramic component in this embodiment is the same as the production process of aluminum-zinc electrode in Embodiment 7.

Embodiment 15:

This embodiment is different from Embodiment 7 only in that: Manufacturing method for base metal combination electrode of electronic ceramic component of the present embodiment comprises: using a flame spraying device described in Embodiment 12 to spray the base metal electrode material described in Embodiment 11 to the electrode surface of the electronic ceramic chip of the electronic ceramic component, wherein said electrode material is aluminum and nickel. That's to say, nickel replaces zinc used in Embodiment 7.

The production process of aluminum-nickel electrode of electronic ceramic component in this embodiment is the same as the production process of aluminum-zinc electrode in Embodiment 7.

Since aluminum material has good conductivity and can be adhered with electronic ceramic body very well, thermal spraying method is used here to spray the aluminum material which serves as electrode material to the chip of ceramic component. Furthermore, in order to make sure the electrode has good weldability, copper, zinc, nickel or tin is successively sprayed on the aluminum electrode layer as the electrode material of the weld layer, ensuring the reliability of the weld, wherein two types of base metal material together constitute a cheap electrode and replace the original expensive silver electrode or copper electrode which is a little expensive. Furthermore, compared with the fabrography for applying silver or copper electrode material, thermal spraying has simple technological process, high preparation efficiency and low cost. Furthermore, it may form various electrode structures as needed by replacing fixture tray assemblies.

All disclosed above are only preferred embodiments of the present invention, and do not limit the scope of the claims. Therefore, the invention is intended to cover equivalent arrangements included within the scope of the invention.

What is claimed is:

1. A manufacturing method for base metal combination electrode of electronic ceramic component comprising an electronic ceramic chip and said base metal combination electrode, characterized by comprising:

using thermal spray equipment to spray the base metal electrode material to the surface of electronic ceramic chip;

wherein said using thermal spray equipment to spray the base metal electrode material to the surface of electronic ceramic chip comprises:

a preparation step of loading material: loading the base metal electrode material into a spray gun of said thermal spray equipment connecting said spray gun with power or gas source, connecting it with compressed air at the same time, and adjusting the nozzle of the spray gun to face toward a fixing device for fixing a plurality of electronic ceramic chips; and a base metal electrode layer spraying step: opening the spray gun and spraying the base metal electrode material to the surface of the plurality of electronic ceramic chips in said fixing device;

wherein said preparation step of loading material comprises: loading first base metal material into a first spray gun of said thermal spray equipment loading second base metal material into a second spray gun of said thermal spray equipment connecting said first spray gun and second spray gun with power supply or gas source, connecting them with compressed air at the same time, and respectively adjusting the nozzles of said first spray gun and second spray gun to face toward a first fixing device and a second fixing device for fixing a plurality of electronic ceramic chips;

said base metal electrode layer spraying step comprises:

a spraying step of the frontal side of first base metal electrode layer: opening a first spray gun and spraying first base metal electrode material to the frontal sides of the plurality of electronic ceramic chips in a first fixing device;

a spraying step of the reverse side of the first base metal electrode layer: reversing said first fixing device, opening the first spray gun, and spraying the first base metal electrode material to the reverse sides of said plurality of electronic ceramic chips;

a shifting step of the electronic ceramic chips: shifting and fixing the plurality of electronic ceramic chips sprayed with the first base metal electrode layer on both sides to a second fixing device;

a spraying step of the reverse side of a second base metal electrode layer: opening a second spray gun and spraying second base metal electrode material to the first base metal electrode layer on the reverse sides of the plurality of electronic ceramic chips;

a spraying step of the frontal side of the second base metal electrode layer: reversing said second fixing device, opening the second spray gun, and spraying the second base metal electrode material to the first base metal electrode layer on the frontal sides of said plurality of electronic ceramic chips;

wherein the spraying precedence order of the frontal sides or the reverse sides of the electronic ceramic chips may change.

2. The manufacturing method for base metal combination electrode of electronic ceramic component according to claim 1, characterized in that:

after said preparation step of loading material, alternatively, said base metal electrode layer spraying step comprises:

a spraying step of the frontal side of a first base metal electrode layer: opening a first spray gun and spraying first base metal electrode material to the frontal sides of the plurality of electronic ceramic chips in a first fixing device;

a shifting step of the electronic ceramic chips: shifting and fixing the plurality of electronic ceramic chips sprayed with the first base metal electrode layer on the frontal sides to a second fixing device;

a spraying step of the frontal side of the second base metal electrode layer: opening a second spray gun, and spraying second base metal electrode material to the first base metal electrode layer on the frontal sides of the plurality of electronic ceramic chips;

a shifting step of the electronic ceramic chips: shifting and fixing the plurality of electronic ceramic chips sprayed with the first base metal electrode layer and the second base metal electrode layer on the frontal sides to the first fixing device, wherein the reverse sides of said plurality of electronic ceramic chips align to said first spray gun;

a spraying step of the reverse side of the first base metal electrode layer: opening the first spray gun and spraying the first base metal electrode material to the reverse sides of the plurality of electronic ceramic chips in the first fixing device;

a shifting step of the electronic ceramic chips: shifting and fixing the plurality of electronic ceramic chips sprayed with the first base metal electrode layer on the reverse sides to the second fixing device, wherein the reverse sides of said plurality of electronic ceramic chips align to said second spray gun;

a spraying step of the reverse side of the second base metal electrode layer: opening the second spray gun and spraying the second base metal electrode material to the first base metal electrode layer on the reverse sides of the plurality of electronic ceramic chips;

wherein the spraying precedence order of the frontal sides or the reverse sides of the electronic ceramic chips may change.

3. The manufacturing method for base metal combination electrode of electronic ceramic component according to claim 1 or 2, characterized in that:

said fixing device is a fixture tray assembly, said first fixing device and second fixing device are a first fixture tray assembly and a second fixture tray assembly, said fixture tray assembly is positioned on a turn table, said fixture tray assembly comprises an upper fixture tray and a lower fixture tray which have safe edge hole sites, wherein the plurality of cleaned electronic ceramic chips are fixed to the safe edge hole sites in said upper fixture tray and lower fixture tray and are clamped between said upper fixture tray and lower fixture tray.

4. The manufacturing method for base metal combination electrode of electronic ceramic component according to claim 3, characterized in that:

the contours of said first fixture tray assembly and second fixture tray assembly are determined as needed, but are not limited to any particular contour;

the shape of the safe edge hole site of said first fixture tray assembly is determined according to the shape of the electronic ceramic component, but is not limited to any particular shape;

the shape of the safe edge hole site of said second fixture tray assembly is configured according to the shape of the second base metal electrode layer, the shapes and areas of the safe edge hole sites of the upper fixture tray and lower fixture tray of said second fixture tray assembly may be same or different;

the area of the safe edge hole site of said second fixture tray assembly may be smaller than, equal to or bigger than the area of the safe edge hole site of the first fixture tray assembly.

5. The manufacturing method for base metal combination electrode of electronic ceramic component according to claim 1 or 2, characterized in that:

said fixing device is positioned on a conveyor belt, forming a continuous automation line device.

6. The manufacturing method for base metal combination electrode of electronic ceramic component according to claim 1 or 2, characterized in that:

said first base metal electrode material is aluminum, said second base metal electrode material is copper, zinc, nickel or tin; according to the mechanical strength requirements of manufacture process, said aluminum electrode material may be pure aluminum or the aluminum alloy with more than 40% of aluminum; the copper electrode material may be pure copper or the copper alloy with more than 40% of copper; the zinc electrode material may be pure zinc or the zinc alloy with more than 40% of zinc; the nickel electrode material may be pure nickel or the nickel alloy with more than 40% of nickel; the tin electrode material may be pure tin or the tin alloy with more than 40% of tin.

* * * * *